United States Patent [19]

Lobach

[11] 4,362,385

[45] Dec. 7, 1982

[54] PROCESS AND ARRANGEMENT FOR COPYING MASKS ON A WORKPIECE WITH ARRANGEMENT FOR CORRECTION OF ALIGNMENT ERRORS

[75] Inventor: Ernst Lobach, Eschen, Liechtenstein

[73] Assignee: Censor Patent-und Versuchsanstalt, Vaduz, Liechtenstein

[21] Appl. No.: 197,992

[22] PCT Filed: Feb. 7, 1980

[86] PCT No.: PCT/EP80/00007

§ 371 Date: Oct. 14, 1980

§ 102(e) Date: Oct. 10, 1980

[87] PCT Pub. No.: WO80/01722

PCT Pub. Date: Aug. 21, 1980

[30] Foreign Application Priority Data

Feb. 14, 1979 [DE] Fed. Rep. of Germany ....... 2905636

[51] Int. Cl.[3] ...................... G03B 27/42; G01B 11/26; G03B 41/00; G05B 3/04

[52] U.S. Cl. ...................................... 355/77; 250/548; 318/640; 355/53; 356/401

[58] Field of Search .................. 355/40, 41, 53, 54, 355/77, 86, 95; 356/150, 400, 401; 250/548, 557; 318/640

[56] References Cited

U.S. PATENT DOCUMENTS

| | | | |
|---|---|---|---|
| 3,814,845 | 6/1974 | Hurlbrink et al. ................. | 358/101 |
| 3,955,072 | 5/1976 | Johannsmeier et al. ............. | 355/86 |
| 4,052,603 | 10/1977 | Karlson ............................... | 356/400 |
| 4,127,777 | 11/1978 | Binder ................................. | 356/400 |
| 4,131,804 | 12/1978 | Sick et al. ........................... | 356/401 |
| 4,140,392 | 2/1979 | Lacombat et al. .................. | 355/53 |
| 4,153,371 | 5/1979 | Koizumi et al. .................... | 356/401 |
| 4,171,162 | 10/1979 | Gerard et al. ....................... | 356/401 |
| 4,172,656 | 10/1979 | Lacombat et al. .................. | 355/77 |
| 4,251,160 | 2/1981 | Bouwhuis et al. .................. | 356/150 |

FOREIGN PATENT DOCUMENTS 2246384 3/1973 Fed. Rep. of Germany.
2633297 1/1978 Fed. Rep. of Germany.

*Primary Examiner*—L. T. Hix
*Assistant Examiner*—Alan Mathews
*Attorney, Agent, or Firm*—Karl F. Ross

[57] ABSTRACT

In a process and an arrangement for the copying of masks on a workpiece, especially for the projection copying on a semiconductor substrate for the production of integrated circuitries, a mask pattern is imaged on respective different, predetermined areas of the workpiece by a shifting of the workpiece in the image plane. In order to increase the accuracy of the individual imagings, the alignment error between the image of the mask pattern and the predetermined area of the workpiece is determined during the imagings of the mask pattern on the workpiece. The predetermined value of the displacement of the workpiece to the area for a subsequent imaging or the position of the mask is corrected to the extent of the alignment error.

10 Claims, 3 Drawing Figures

PROCESS AND ARRANGEMENT FOR COPYING MASKS ON A WORKPIECE WITH ARRANGEMENT FOR CORRECTION OF ALIGNMENT ERRORS

CROSS-REFERENCE TO RELATED APPLICATION

This application is a PCT application based upon PCT/EP80/00007 of Feb. 7, 1980 claiming priority in terms of a German application No. P2905636.8 filed Feb. 14, 1979, and both Convention priority and PCT priority are hereby claimed.

FIELD OF THE INVENTION

The invention relates to a process and an apparatus for the copying of masks on a workpiece, especially for projection copying upon a semiconductor substrate for the manufacture of integrated circuitries, wherein a mask pattern is imaged in consecutive steps on respective different, predetermined areas of the workpiece by a shifting of the workpiece in the image plane.

BACKGROUND OF THE INVENTION

For the manufacture of integrated circuits it is necessary to image a number of masks with different circuits patterns upon a particular location of the semiconductor substrate.

This results in the exposure of a photosensitive layer of the substrate which serves after its development to cover the substrate at desired locations in chemical and physical process steps, such as etching and diffusion operations, carried out between imagings of different masks. A high degree of precision is required for the manufacture of the integrated circuitries. The permissible deviations of the successive imagings of the mask patterns lie for example below one micron. In order to obtain such a precision, the circuit patterns disposed on the mask are most often imaged on the substrate in reduced fashion, e.g. reduced by a factor of 10, via a projection objective. Especially with highly integrated circuits it has been found to be advantageous if each chip, i.e. each identical circuit, is exposed individually.

Pursuant to a known process, the semiconductor substrate is adjusted for this purpose with reference to an imaginary coordinate system fixedly tied to the projection-exposure equipment. With the aid of precise shifting devices (e.g. with the aid of a laser-interferometrically controlled X-Y table) the areas of the substrate corresponding to the individual circuits are pushed under the projection objective without any readjustment. The disadvantage of this indirect adjustment is evident since even at the first exposure the maladjustment of the corresponding substrate area relative to the coordinate system and the maladjustment of the mask relative to the coordinate system are added to each other. The deviations due to temperature fluctuations, for example, are not taken into consideration.

It has further become known to adjust the substrate relatively to the mask directly by way of the projection objective prior to the exposure of the individual areas corresponding to the respective chips. The movement of the substrate for the exposure or imaging of the mask pattern on the predetermined areas then occurs as described above. A drawback remains, however, in that deviations caused by disturbances during traverse of the predetermined areas are not taken into consideration.

Finally it has already been proposed to assign to the substrate individual adjustment marks for each imaging area, i.e. for each chip.

After each imaging of the circuit pattern and the subsequent shifting of the substrate to the next predetermined area, the substrate and the mask are adjusted by way of the projection objective. Though this procedure avoids the disadvantages inherent in the one referred to above, the overall processing time for a substrate is increased by the sum of the individual adjustment times. This causes an uneconomical reduction in throughput.

OBJECT OF THE INVENTION

The object of the invention is a process and a device of the type initially stated which enables a maximum possible precision of the mask imagings on the predetermined areas of the substrate without significantly increasing the processing time.

SUMMARY OF THE INVENTION

According to the invention, at least during a number of imagings of the mask pattern on the workpiece, a determination of the alignment error between the image of the mask pattern and the respectively predetermined area of the workpiece is initiated and that the predetermined value of the displacement of the workpiece to the area for a subsequent imaging and/or the position of the mask for a subsequent imaging is corrected to the extent of the alignment error.

Thus, by the procedures according to the invention the existing but admissible alignment error is ascertained during the exposure or the imaging of the mask pattern on the substrate. One obtains thereby a compensation of major deviations from the assigned position without incurring significant losses of time. When the time needed for ascertaining the alignment error is less than or equal to the exposure period, no loss of time occurs. If, however, the measuring time for ascertaining the alignment error exceeds the exposure period, a loss of time consists merely in the difference between the exposure period and the measuring time. In this case it can be advantageous to determine the alignment error after a predetermined number, e.g. after every second or third, of the imagings or shifts of the workpiece. It is furthermore advantageously possible to perform the determination of the alignment error, within a sequence of imagings of the mask pattern, in coordinates differing from one instance to another, e.g. in coordinates of the image plane and perpendicular thereto.

SPECIFIC DESCRIPTION

Figure 1:
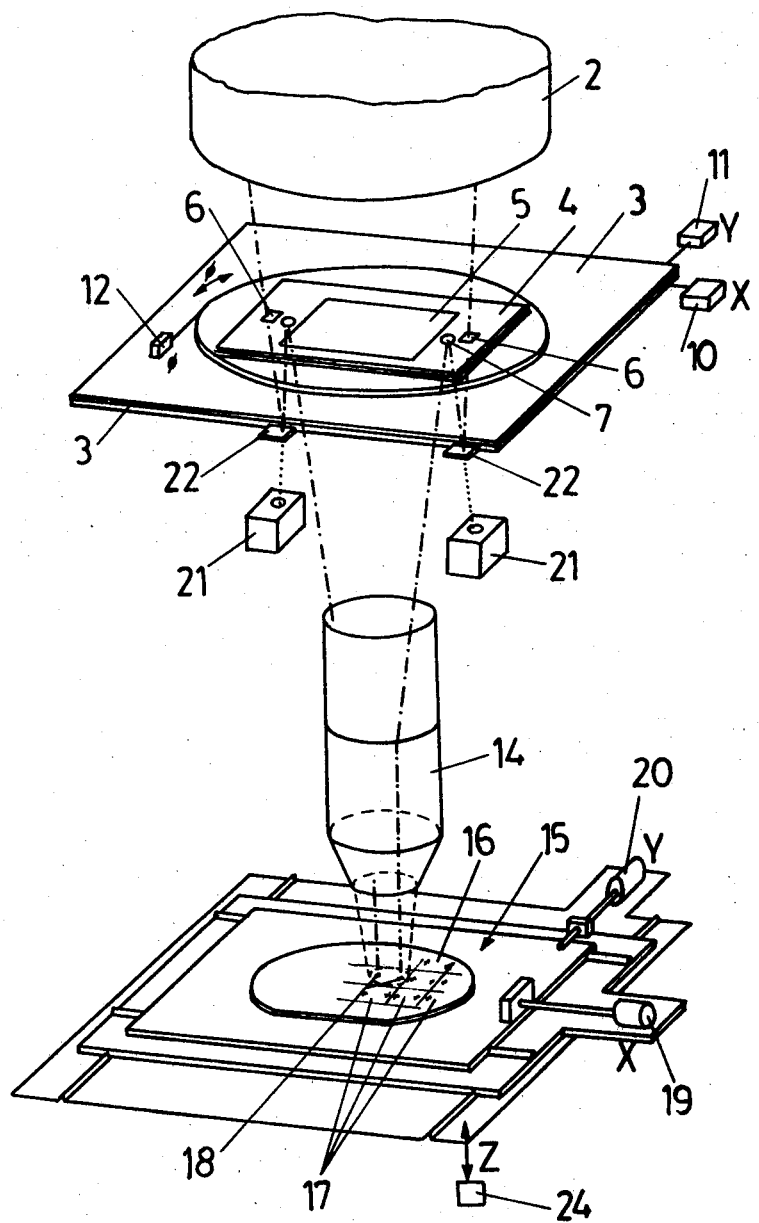
FIG. 1 is a schematic oblique view of an arrangement for the projection copying of masks on a semiconductor substrate.

In FIG. 1 the essential parts of an arrangement for the projection copying of masks have been illustrated. The semiconductor substrate 16, to be exposed according to the known step-and-repeat process, is held by suction onto a substrate table 15. This substrate table 15 is displaceable parallel to the coordinates X and Y of the image plane and along the optical axis (Z axis) of the projection system with the aid of stepping motors 20, 19 and 24. Above the substrate 16 there is disposed a projection objective 14 above which there lies in turn the mask 4 held on a mask stage 3. The mask stage 3 is also provided with stepping motors 10, 11 and 12 which serve for the adjustment for the mask 4 parallel to the coordinates X, Y and angularly as shown by $\phi$ in the object plane. For copying the circuit pattern 5, the mask 4 is exposed by means of an illuminating device 2 so that the circuit pattern 5 is imaged by way of the projection objective 14 upon the area 17 of the substrate 16 allocated to the corresponding chip. In order to achieve a precise alignment of the circuit pattern 5 with circuit elements already present in the areas 17 of the substrate 16, each of these areas 17 has adjustment marks 18 allocated to it. The mask 4 likewise comprises alignment patterns 6. With the present arrangement an adjustment or a determination of the alignment error between the image of the mask pattern 5 and the respectively predetermined area 17 of the substrate can be carried out in the exposure light. The alignment patterns 6 of the mask 4 are, for example, windows transparent to the exposure light so that the corresponding rays of the illuminating device 2 impinge through these windows 6 upon semitransparent mirrors 22 and are reflected by them back to the mask. At the corresponding locations of the mask there are provided mirrors 7 which cast these rays via the projection objective 14 upon the adjustment marks 18 of the respective area 17 of the substrate. The image of the alignment pattern 6 on the substrate 16 and the adjustment marks 18 are now retroprojected by way of the projection objective 14, the mirrors 7 as well as the semitransparent mirrors 22 upon evaluating devices 21. These evaluating devices can ascertain the alignment error between the adjustment marks 18 and the image of the alignment pattern 6 of the mask 4 whereby the alignment error of the image of the mask pattern 5 relative to the predetermined area 17 or circuit elements already present thereon is also determined. The alignment patterns, adjustment marks, the means for imaging same in one another as well as the evaluating devices can be designed in any desired, known manner.

Figure 2:
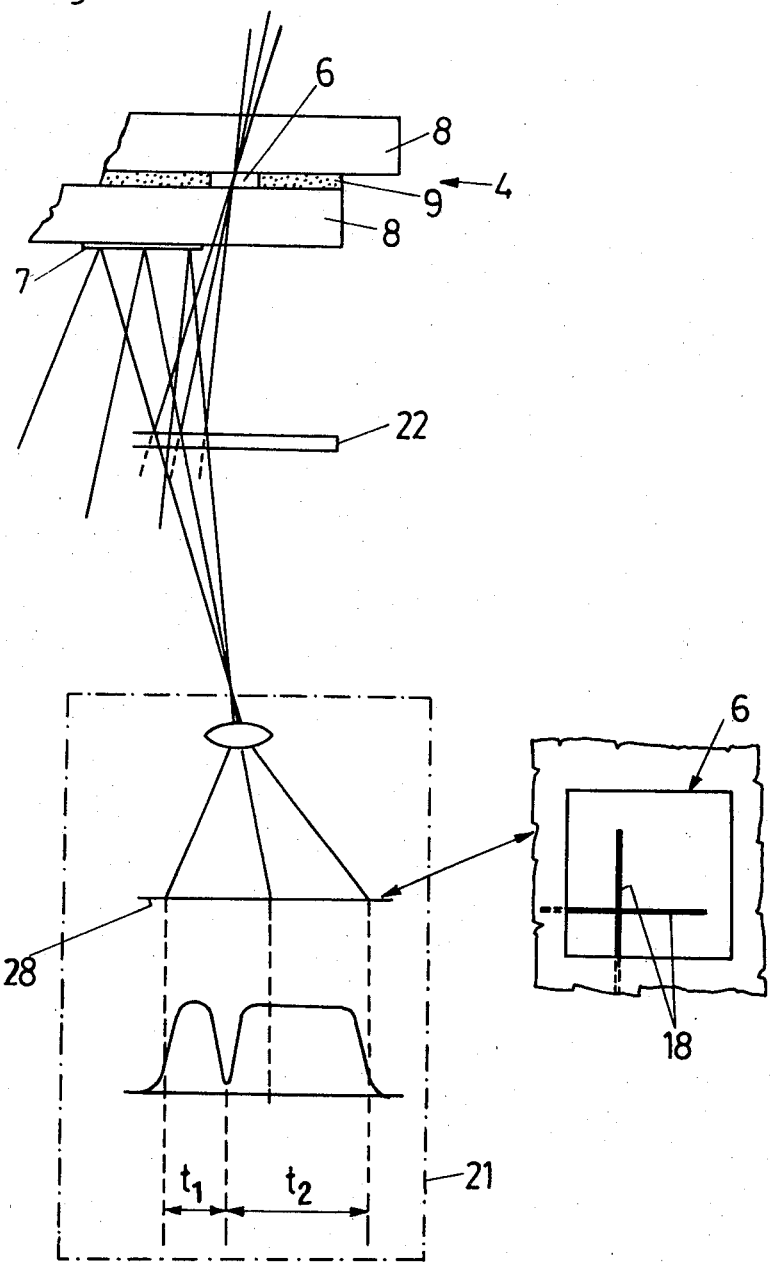
FIG. 2 is a diagram which shows the principle of determination of the alignment error.

FIG. 2 shows schematically a mode of realization. An adjustment mark 18 on the substrate is designed as a reflecting or nonreflecting cross to which an alignment pattern of mask 4, consisting of a window 6, is allocated. The mask 4 consists of two glass plates 8 between which the masking layer 9 is disposed. On the side of the lower glass plate 8 facing the substrate there is formed a mirror 7 in an area conjugated with the adjustment mark 18 in regard to the projection objective. This mirror 7 reflects the image of the window 6 in the substrate 16 and the adjustment mark 18 through the semitransparent mirror 22 onto a detection plane 28 of the evaluating device 21. By scanning the intensity values in this detection plane 28 it is possible to obtain, for example, timing signals t1 and t2 proportionally to the respective alignment error.

With the aid of two such illuminating devices 21 and the allocated alignment patterns 6 of the mask and adjustment marks 18 of the substrate it is thus possible to determine the alignment errors in the coordinates X, Y and $\phi$. The determination of the alignment error in the direction Z, i.e. of the focusing adjustment of the image on the substrate, occurs in known manner not shown. Such a known process is explained, for example, in German open specification No. 26 33 297. It should be pointed out, once more, that the manner of determination of the alignment error in the designed is not a subject matter of the present invention and can therefore be carried out in any way whatsoever.

Figure 3:
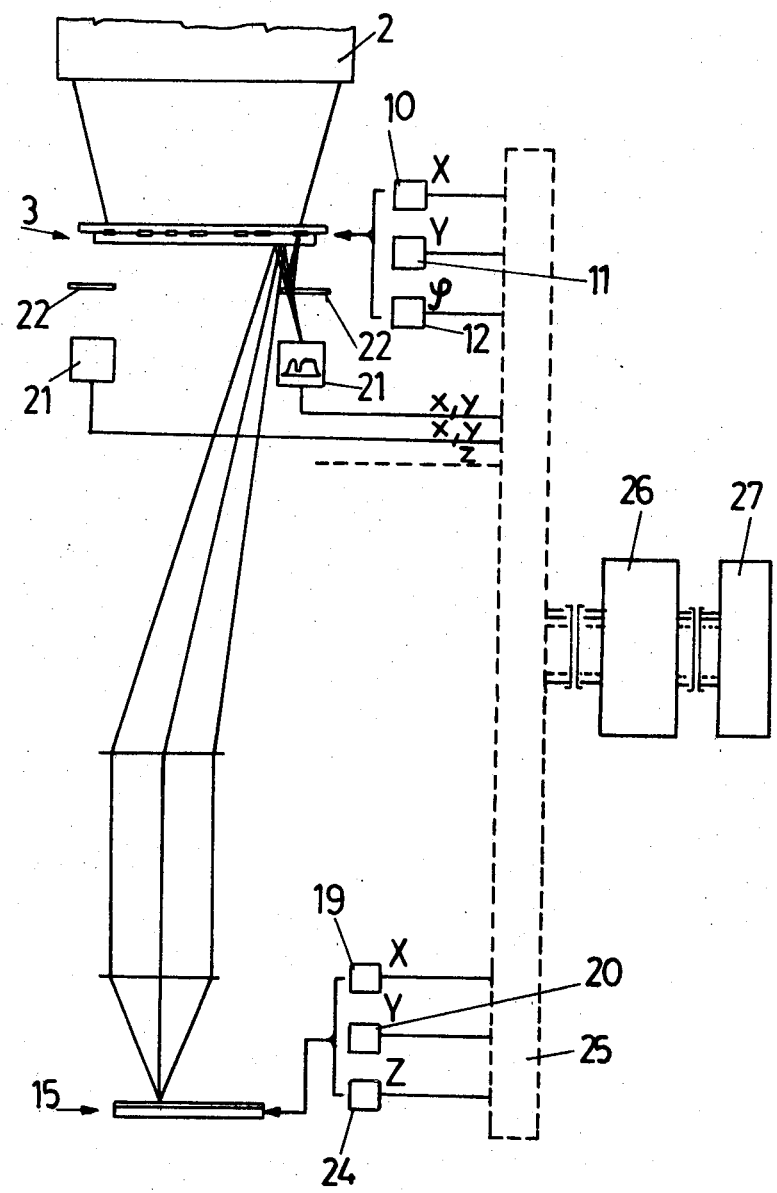
FIG. 3 is a block diagram of the arrangement according to FIG. 1.

FIG. 3 shows a diagram of the arrangement according to the invention in functional blocks. The stepping motors 10, 11 and 12 for positioning the mask, the evaluating devices 21 for determining the alignment error and the stepping motors 19, 20 and 24 for displacing the substrate are connected via a junction 25, which comprises the necessary interface circuits, to a computer 26 dialoguing in turn with a memory 27. The process according to the invention can be realized with the aid of this arrangement. If the mask pattern 5 of the mask 4 is to be imaged in consecutive steps in the areas 17 corresponding to the chips to be produced, the substrate 16 and the mask 4 are relatively arranged in the coordinates X, Y, Z and $\phi$ by way of the projection objective 14. The substrate table 15 then displaces the first area 17 to be exposed under the projection area of the projection objective whereupon the imaging of the mask pattern 5 is performed. In accordance with the invention the alignment error between the image of the mask pattern on the substrate and the respectively predetermined area 17 of the substrate is now ascertained by comparison of the position of the alignment pattern relative to the adjustment marks during this imaging, i.e. during exposure. This determination of the alignment error is advantageously carried out in the same light of the illuminating device which is also used for the imaging of the mask pattern. It is to be borne in mind, however, that an individual light source could equally be used for the imaging of the alignment patterns 6 and the adjustment marks 18 in one another. After termination of the exposure the substrate table 15 is shifted with the aid of the stepping motors 19 or 20 until the next area 17 arrives in the projection area of the projection objective. This displacement occurs according to the preprogrammed values. In order to avoid an addition of maladjustments, which could be due for example to temperature fluctuations and shift tolerances of the stepping motors, the position of the mask 4 is now corrected to the extent of the previously measured alignment mirror. Thereupon the exposure of the new area 17 can be performed with, again, determination of the current alignment error. It will be readily understood that with this process according to the invention it is possible to avoid the addition of adjustment errors without retarding the course of the process in comparison with exposure without adjustment. Only in the event that the determination of the alignment error takes longer than the exposure time provided for the imaging of the mask pattern will it be necessary to delay the displacement to the respective next area until the determination of the alignment errors has been completed. In this case one may also, however, if time could be gained thereby in dependence upon the evaluating device, ascertain the alignment error in a sequence of imagings in coordinates differing from one instance to another and carry out the corresponding corrections. It is also conceivably that the alignment error be determined only after a predetermined number of imagings or displacements of the substrate, e.g. after every other one.

A precondition for the execution of the process according to the invention is merely a certain basic precision of the displacement devices, i.e. the shifting of the substrate 16 by one area 17 must be possible within the admissible tolerance limit for the alignment error. In order to avoid a continuous correction of the mask within the measuring error it might be advantageous to compare the alignment error with this limiting value and to carry out a correction only when the latter is surpassed. Provision is made that with an excessive correction value for the position of the mask the same not be displaced but that instead the predetermined value for the shift of the substrate is corrected.

The process according to the invention offers furthermore the possibilities of leaving the mask position always unchanged and performing the correction of the alignment error through a change of the displacement path for the substrate or for mask and substrate in any desired coordinates.

I claim:

1. In a method of copying a pattern of a mask member upon a semiconductor substrate member in the production of integrated circuits, whereby a semiconductor substrate member is disposed in an image plane of an objective having an optical axis and an image of said mask pattern is cast upon a first predetermined area of said substrate member during an exposure interval, said substrate member is then shifted in said image plane, a second predetermined area of substrate member is positioned along said optical axis and another image of said mask member is cast upon said substrate member, and the sequence is repeated until a multiplicity of predetermined areas of said substrate member have been exposed, the improvement wherein:
   (a) initiating prior to the conclusion of one of said exposure intervals a determination of the alignment error between the mask pattern and the respective predetermined area, said determination being carried out at least in part during one of said exposure intervals; and
   (b) adjusting the position of one of said members prior to a subsequent exposure to correct the relative positions of said members after the respective shift for said subsequent exposure by a value corresponding to said alignment error.

2. The improvement defined in claim 1 wherein said alignment error is compared with a threshold value, and a predetermined value of the shift of said substrate member for the next exposure is corrected by said alignment error upon said alignment error exceeding said threshold value.

3. The improvement defined in claim 1 wherein said alignment error is determined after a predetermined number of exposures and the shift of the substrate member for the exposure following determination of the alignment error is corrected with said value.

4. The improvement defined in claim 1 wherein the alignment error is determined utilizing light of the exposure by comparing positions of alignment patterns of the mask member to positions of adjustment marks allocated to respective predetermined areas of the workpiece.

5. The improvement defined in claim 1 wherein said alignment error is determined by directing light from a source other than the light of said exposure onto adjustment patterns of said mask member and said substrate member.

6. The improvement defined in claim 1 further comprising the step of delaying the shift of the substrate member in step (b) for a period sufficient to enable completion of the determination of the error in step (a).

7. The improvement defined in claim 1 wherein, for successive determinations of alignment error, the adjustment value for different coordinates in the displacement of said substrate member are corrected.

8. The improvement defined in claim 1 wherein the position of said mask member is corrected in step (b).

9. The improvement defined in claim 8 wherein, after a limiting displacement of said mask member, the shift of said substrate is corrected in step (b).

10. The improvement defined in claim 1 wherein said determination is completed prior to the lapse of the exposure interval.

* * * * *

Dedication 4,362,385.—*Ernst Lobach*, Eschen. Liechtenstein. PROCESS AND ARRANGEMENT FOR COPYING MASKS ON A WORKPIECE WITH ARRANGEMENT FOR CORRECTION OF ALIGNMENT ERRORS. Patent dated Dec. 7, 1982. Dedication filed Feb. 20, 1990, by the assignee, Mercotrust Aktiengesellschaft.

Hereby dedicates to the Public the remaining term of said patent.

[ *Official Gazette April 17, 1990* ]